United States Patent
Hayashi et al.

(10) Patent No.: US 7,382,657 B2
(45) Date of Patent: Jun. 3, 2008

(54) SEMICONDUCTOR MEMORY DEVICE HAVING BIT LINE PRECHARGE CIRCUIT CONTROLLED BY ADDRESS DECODED SIGNALS

(75) Inventors: Mitsuaki Hayashi, Kyoto (JP); Wataru Abe, Hirakata (JP); Shuji Nakaya, Kobe (JP); Masakazu Kurata, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 308 days.

(21) Appl. No.: 11/151,639

(22) Filed: Jun. 14, 2005

(65) Prior Publication Data
US 2006/0158942 A1    Jul. 20, 2006

(30) Foreign Application Priority Data
Jun. 17, 2004    (JP)    .............................. 2004-179287

(51) Int. Cl.
*G11C 16/06*    (2006.01)
(52) U.S. Cl. .................. 365/185.25; 365/203; 365/204
(58) Field of Classification Search ........... 365/185.11, 365/185.25, 189.01, 203, 204, 185.25 O, 365/203 X, 204 X
See application file for complete search history.

(56) References Cited

U.S. PATENT DOCUMENTS 5,874,883 A    2/1999    Uemura et al.
6,075,734 A *  6/2000    Jang ............................ 365/203
6,950,360 B2 * 9/2005    Nishida et al. ............. 365/203
7,050,354 B2 * 5/2006    Nicholes ...................... 365/203
7,075,170 B2   7/2006    Oku et al.

FOREIGN PATENT DOCUMENTS

| JP | 06176592   | 6/1994 |
|----|------------|--------|
| JP | 09036312   | 2/1997 |
| JP | 10065110   | 3/1998 |
| JP | 2001196542 | 7/2001 |
| JP | 2003017485 | 1/2003 |
| JP | 2003045989 | 2/2003 |

* cited by examiner

*Primary Examiner*—VanThu Nguyen
(74) *Attorney, Agent, or Firm*—Dickinson Wright, PLLC

(57) ABSTRACT

A semiconductor memory device includes a memory cell array, a charge circuit which compensates for OFF leakage current developed at selected bit lines, a reset circuit having a ground potential corresponding to a potential at non-selected bit lines, a read circuit constituted by a plurality of transistors whose gates are connected to the bit lines, and a bit line precharge circuit which charges the selected bit lines for a fixed time period. As a result of adopting such a configuration, there is no need to provide a transmission gate, such as a column decoder, to a charging path between the read circuit and the bit lines, so that a low-power supply voltage operation can be effected without the influence of a substrate bias effect.

3 Claims, 13 Drawing Sheets

SEMICONDUCTOR MEMORY DEVICE HAVING BIT LINE PRECHARGE CIRCUIT CONTROLLED BY ADDRESS DECODED SIGNALS

BACKGROUND OF THE INVENTION

1. Field of the Invention

The present invention relates to a semiconductor memory device and to a circuit technology through which a low-voltage operation is implemented.

2. Background Art

Conventional art semiconductor memory devices include, for example, a semiconductor memory device disclosed in Patent Document 1, the configuration of a contact-type mask ROM is disclosed.

FIG. 12 is a circuit diagram showing the configuration of the contact-type mask ROM. With the contact-type mask ROM, whether the drains of memory cell transistors are connected to bit lines corresponds to the "1" and "0" states of storage data.

The conventional art semiconductor memory device shown in FIG. 12 includes a memory cell array 1, a column decoder 15, and a read circuit 16.

The memory cell array 1 includes memory cells M(i, j) (i=1 to m, and j=1 to n) each composed of a N-type MOS transistor and arranged in matrix form. As for the memory cells M (i, j), the gates of the memory cells M(i, j) whose positional symbols (i) represent the same numeric value, that is, the gates of the memory cells M(i, j) aligned in the row direction are together connected to common word line selection signal lines WLi (i=1 to m). Also, the sources of the memory cells M (i, j) are connected to a wiring having a ground potential.

When the drains of the memory cells M(i, j) (i=1 to m, and j=1 to n) are connected to bit lines BLj (j=1 to n), output data read from the memory cells M(i, j) (i=1 to m, and j=1 to n) to an output terminal MDATA becomes "1", while in a floating state in which the connections are not made, output data read to the output terminal MDATA becomes "0".

The column decoder 15 includes N-type MOS transistors QNCj (j=1 to n). The drains of the N-type MOS transistors QNCj (j=1 to n) are connected with one another, their sources are connected to the bit lines BLj (j=1 to n), and their gates are each connected to column selection signal lines CDj (j=1 to n).

The read circuit 16 includes P-type MOS transistors QPPS and QPL, a N-type MOS transistor QNRS, and an inverter INVA. With the P-type MOS transistor QPPS, its gate is connected to a precharge control signal line PCLK, its source is connected to a power supply potential line, and its drain is connected to the drains of the N-type MOS transistors QNCj (j=1 to n) constituting the column decoder 15.

With the N-type MOS transistor QNRS, its gate is connected to a reset control signal line RSTS, its source is connected to a ground potential line, and its drain is connected to the drains of the N-type MOS transistors QNCj (j=1 to n) constituting the column decoder 15.

With the inverter circuit INVA, its input end is connected to the drains of the N-type MOS transistors QNCj (j=1 to n) constituting the column decoder 15, and its output end is connected to the output terminal MDATA.

With the P-type MOS transistor QPL, its gate is connected to the output end of the inverter INVA, its source is connected to the power supply potential line, and its drain is connected to the drains of the N-type MOS transistors QNCj (j=1 to n) constituting the column decoder 15.

The ON-state current of the P-type MOS transistor QPL is set so as to become smaller than those of the memory cells M(i, j) (i=1 to m, and j=1 to n) and to become equal to or larger than the total OFF leakage current of all the memory cells aligned on the single bit line.

The reading operation of data of, for example, the memory cell M(1, 1) of the semiconductor memory device having such a configuration will be described with reference to a FIG. 13 timing chart.

Among the column selection signal lines CDj (j=1 to n), the column selection signal line CD1 is brought high and the column selection signal lines CD2 to CDn are brought low. As a result, among the transistors constituting the column decoder 15, the transistor QNC1 is turned on and the other transistors QNC2 to QNCn are turned off.

Also, the reset control signal line RSTS is brought low and the transistor QNRS is turned off. Furthermore, all the word lines WL1 to WLm are brought low and all the memory cell transistors M(i, j) (i=1 to m, and j=1 to n) are turned off.

Then the precharge control signal line PCLK is held high for a fixed time period and the transistor QPPS is held on for a fixed time period, thereby the bit line BL1 is charged to the high level.

After the bit line BL1 has brought to high, the word line WL1 is shifted from the low level, which means a non-selected state, to the high level which means a selected state.

As a consequence, when the drain of the memory cell M(1, 1) is connected to the bit line BL1, electric charge supplied to the bit line BL1 is discharged by the memory cell M(1, 1), so that the bit line BL1 is brought low. In contrast to this, the drain of the memory cell M(1, 1) is not connected to the bit line BL1, the electric charge supplied to the bit line BL1 is not discharged by the memory cell M(1, 1), so that the bit line BL1 is held high.

Because of this, when the drain of the memory cell M(1, 1) is connected to the bit line BL1 to brought the bit line BL1 low, the low-level signal is inputted to the inverter INVA via the on-state transistor QNC1. As a result, the inverter INVA inputs a high-level signal to the gate of the transistor QPL to turn the transistor QPL off, thereby charging to the bit line BL1 is stopped and the high-level signal is outputted to the output terminal MDATA.

In contrast to this, when the drain of the memory cell M(1, 1) is not connected to the bit line BL1 to brought the bit line BL1 high, the high-level signal is inputted to the inverter INVA via the on-state transistor QNC1. As a consequence, the inverter INVA inputs a low-level signal to the gate of the transistor QPL to turn the transistor QPL on, thereby charging is effected to compensate for electric charge discharged from the bit line BL1 due to the OFF leakage currents of the memory cells M(i, 1) (i=1 to m) connected to the bit line BL1. As a result, the bit line BL1 is held high and a low-level signal is outputted to the output terminal MDATA.

Patent Document 1: Japanese Unexamined Patent Publication H06-176592. (page 2, paragraphs 0002 to 0006 and FIG. 2)

Problems brought about by the conventional art semiconductor memory device will be described below. With the configuration of the conventional art semiconductor memory device, the drains and sources of the transistors QNCj (j=1 to n) constituting the column decoder 15 are each connected to the read circuit 16 and the bit lines BLj (j=1 to n) without ground connections. Because of this, the threshold voltages at the transistors QNCj (j=1 to n) are increased by the substrate bias effect. The influence of the increased threshold voltages resulting from the substrate bias effect becomes large as the power supply voltage is decreased, so that the ON-state current of the transistors QNCj constituting the column decoder 15 is decreased greatly. Therefore, the supply of the electric charge to the bit lines BLj cannot be provided sufficiently by the transistor QPL provided to the read circuit 16 to compensate for the OFF leakage currents developed at the memory cells connected to the bit lines. As a consequence, the potentials at the drains of the transistors QNCj, which constitute the column decoder 15 connected to the read circuit 16, cannot be shifted to the low level, so that the potentials are held at the high level. Therefore, the function of the semiconductor memory device is impaired.

In recent years, as a need for operation effected with low power supply voltage has been increased rapidly with the advance of techniques for manufacturing smaller semiconductor devices, it has been particularly required that apparatus provided with semiconductor memory devices feature low power consumption to pursue their portability and so on. However, because of the suppression of power consumption increased by the OFF leakage current of transistors, it is difficult to lower the threshold voltage at the transistors; hence, this not only exists as a determinant of the range of the power supply voltage with which the semiconductor memory devices operate but brings about a big problem in the implementation of low-power semiconductor memory devices.

As a result, methods for lowering only the threshold voltage at some transistors during their manufacture and for reducing the substrate bias effect through the boost of the gate voltage at some transistors have been proposed. To lower the threshold voltage during their manufacture, however, there is a necessity to provide special manufacturing steps in addition to normal ones. In addition, to boost the gate voltage, there is a necessity to provide a booster circuit having a relatively large area, which brings about increases in not only the size of semiconductor memory devices but their production cost.

SUMMARY OF THE INVENTION

The present invention is provided for the purpose of solving the problem associated with the conventional art and hence, it is an object of the invention to provide a semiconductor memory device in which a read circuit and bit lines can be connected with each other without the provision of such a column decoder constituted by the transistors, whose drains are connected to the read circuit and whose sources are connected to the bit lines, and in which a low-voltage operation can be performed without the influence of the substrate bias effect.

To achieve the object, the semiconductor memory device according to the invention has a configuration in which bit lines and a read circuit are direct-connected with each other without using the medium of a column decoder and in which transistors, which compensate for OFF leakage current developed at memory cells, are direct-connected to the bit lines.

A semiconductor memory device according to a first invention includes a memory cell array, a charge circuit, a bit line reset circuit, and a read circuit. The memory cell array includes a plurality of memory cells arranged in matrix form, a plurality of word lines connected to the memory cells, and a plurality of bit lines connected to the memory cells. The charge circuit includes a plurality of charging transistors which charges the corresponding bit lines. The bit line reset circuit includes a plurality of resetting transistors respectively forcing potentials of the bit lines to a ground potential. The read circuit includes a plurality of reading transistors, whose gates are connected to the corresponding bit lines, and outputs information according to the on and off states of the reading transistors.

According to the semiconductor memory device of the first invention, the charging transistors are direct-connected to the bit lines, and with the connection between the bit lines and the read circuit, the bit lines are direct-connected to the gates of the transistors constituting the read circuit without using the medium of the transistors constituting the column decoder described in the explanation of the conventional art. Because of this, in the compensation for the OFF leakage current developed at the bit lines, a low-voltage operation can be effected without the influence of the substrate bias effect of the transistors.

In the semiconductor memory device according to the first invention, it is preferable that the charge circuit have a configuration, in which the gates of the charging transistors are each connected to a plurality of decode signal lines for selecting the bit lines, and the bit line reset circuit have a configuration in which the gates of the resetting transistors are each connected to a plurality of reset signal lines.

A semiconductor memory device according to a second invention corresponds to the semiconductor memory device according to the first invention having an additional bit line precharge circuit which includes a plurality of precharging transistors used for charging the bit lines for a fixed time period.

According to the semiconductor memory device of the second invention, as in the case of the semiconductor memory device according to the first invention, it is possible to effect a low-voltage operation and furthermore, the provision of the precharging transistors to the bit lines allows a time taken to charge the bit lines to be reduced greatly, thereby a high-speed reading operation can be implemented.

In the semiconductor memory device according to the second invention, it is preferable that the charge circuit have a configuration in which the gates of the charging transistors are each connected to the decode signal lines for selecting the bit lines, the bit line precharge circuit have a configuration in which the gates of the precharging transistors are each connected to a plurality of precharge signal lines, and the bit line reset circuit have a configuration in which the gates of the resetting transistors are each connected to the reset signal lines.

Furthermore, in the semiconductor memory device according to the second invention, it is preferable that the charging transistors, the precharging transistors, the resetting transistors, and the reading transistors are N-type MOS transistors.

By adopting such a configuration, not only a low-voltage operation and a high-speed reading operation are effected, but the following effects are achieved: by using the same N-type MOS transistors as the memory cells as the charging transistors provided to the bit lines, that is, the transistors for compensating for the OFF leakage current, the precharging transistors, the resetting transistors, and the reading transistors, these transistors can be placed in the same well on the semiconductor substrate; therefore, the transistors can be formed without the provision of regions for well isolation; and the ON-state current of the N-type MOS transistor is larger than that of the P-type MOS transistor, so that the widths of the charging transistors, that is, the transistors for compensating for the off leakage current, and the precharging transistors can be narrowed, thereby a smaller semiconductor memory device can be implemented.

A semiconductor memory device according to a third invention corresponds to the semiconductor memory device according to the first invention whose charge circuit includes a plurality of first operation controlling transistors allowing the charging transistors to effect the charging operation and whose precharge circuit includes a plurality of second operation controlling transistors allowing the precharging transistors to effect the charging operation.

According to the semiconductor memory device of the third invention, a low-voltage operation and a high-speed reading operation can be effected as in the case of the semiconductor memory device according to the second invention. Moreover, it becomes possible to control whether the bit lines are charged by the charging transistors, that is, the transistors for compensating for the OFF leakage current, provided to the bit lines and by the precharging transistors also provided to the bit lines. As a result, when a semiconductor storage system having the plurality of semiconductor memory devices as memory blocks is built, the bit lines can be charged selectively at each memory block. Because of this, the bit lines are not charged at the memory blocks where no reading is performed, so that power consumption can be reduced.

In the semiconductor memory device according to the third invention, it is preferable that the charge circuits have a configuration in which the charging transistors and the first operation controlling transistors are each connected to the bit lines in a state in which the charging transistors and the first operation controlling transistors are connected in series with each other, the gates of the first operation controlling transistors are connected to operation control signal lines, and the gates of the charging transistors are connected to the decode signal lines. Also, it is preferable that the bit line precharge circuit have a configuration in which the precharging transistors and the second operation controlling transistors are each connected to the bit lines in a state in which the precharging transistors and the second operation controlling transistors are connected in series with each other, the gates of the second operation controlling transistors are connected to the operation control signal lines, and the gates of the precharging transistors are each connected to the precharge signal lines. Furthermore, it is preferable that the bit line reset circuit have a configuration in which the gates of the resetting transistors are connected to the reset signal lines.

A semiconductor storage system according to a fourth invention has a plurality of memory blocks and each of the memory blocks is composed of the single semiconductor memory device according to third invention. The semiconductor storage system according to the fourth invention also has a logic circuit which logically synthesizes outputs from the memory blocks, and to the operation control signal line of the individual memory blocks, selection signals are inputted as operation control signals.

According to the semiconductor storage system of the fourth invention, a low-voltage operation and a high-speed reading operation can be effected as in the case of the semiconductor memory device according to the second invention. Furthermore, the bit lines can be charged selectively at each memory block by the charging transistors, that is, the transistors for compensating for the OFF leakage current, provided to the bit lines and by the precharging transistors also provided to the bit lines. Because of this, the bit lines are not charged at the memory block where no reading is performed, so that power consumption can be reduced further.

A semiconductor memory device according to a fifth invention corresponds to the semiconductor memory device according to the first invention whose charge circuit has a configuration in which at least two charging transistors are provided to the individual bit lines, at least one of at least two charging transistors are connected to the individual bit lines, and the remaining charging transistors are in a floating state in relation to the individual bit lines.

According to the semiconductor memory device of the fifth invention, a low-voltage operation and a high-speed reading operation can be effected as in the case of the semiconductor memory device according to the second invention and furthermore, the following process can be conducted: when the amount of the OFF leakage current developed at the bit line is large because the memory cells, whose drains are connected to the bit line, are high in number, from among the charging transistors, i.e., the transistors for compensating for the OFF leakage current, provided to the bit line, for example, the transistor having the largest ON-state current is selected and then the selected transistor is connected to the bit line by using the same mask as that used for connecting the drains of the memory cells and the bit lines; but in contrast to this, when the amount of the OFF leakage current developed at bit line is small because the memory cells, whose drains are connected to the bit line, are low in number, of the two charging transistors, i.e., the transistors for compensating for the OFF leakage current, provided to the bit line, for example, the transistor having a smaller ON-state current is selected and the selected transistor is connected to the bit line by using the same mask as that used for connecting the drains of the memory cells and the bit lines. As a result, electric charge supplied to the bit line is not supplied to an excessive degree in relation to electric charge discharged from the bit line as the OFF leakage current. Because of this, when the drain of the memory cell to be read is connected to the bit line, it is possible to shorten a time taken to discharge the electric charge supplied by the bit line precharge circuit and to effect the high-speed reading operation.

In the semiconductor memory device according to the fifth invention, it is preferable that the charge circuit have a configuration in which the gates of the charging transistors are each connected to the decode signal lines for selecting the bit lines, and the bit line reset circuit have a configuration in which the gates of the resetting transistors are each connected to the reset signal lines.

Furthermore, in the semiconductor memory device according to the fifth invention, it is preferable that the connect structure of the charging transistors to the bit lines be the same as that of the memory cells to the bit lines. Such a configuration allows the charging transistors and the bit lines to be connected with each other through the use of the same mask as that used for connecting the drains of the memory cells and the bit lines, so that no additional manufacturing steps are required.

A semiconductor memory device according to a sixth invention corresponds to the semiconductor memory device according to the first invention further having a bit line precharge circuit which includes a common precharging transistor, which charges the bit lines for a fixed time period, and a plurality of selecting transistors which select the bit lines to be precharged.

According to the semiconductor memory device of the sixth invention, a low-voltage operation and a high-speed reading operation can be effected as in the case of the semiconductor memory device according to the second invention. Moreover, instead of the provision of the precharging transistor to each bit line, the provision of, for instance, the single and common precharging transistor to the bit lines makes it possible to secure a large mask layout region for the precharging transistor. As a consequence, the width of the precharging transistors can be expanded; therefore it is possible to increase the ON-state current greatly and to shorten a time taken to precharge the bit lines more, thereby a higher-speed reading operation can be effected.

In the semiconductor memory device according to the sixth invention, it is preferable that the charge circuit have a configuration in which the gates of the charging transistors are each connected to the decode signal lines for selecting the bit lines, the bit line precharge circuit have a configuration in which the gates of the selecting transistors are each connected to the decode signal lines for selecting the bit lines and in which the gate of the precharging transistor is connected to a precharge signal line, and the bit line reset circuit have a configuration in which the gates of the resetting transistors are each connected to the reset signal lines.

As described above, according to the inventions, the bit lines and the read circuit are connected with each other without the use of the column decoder including the transistors shown in the explanation of the conventional art. As a result, a semiconductor memory device can be implemented in which a stable reading operation can be effected even with the low power supply voltage without the influence of a high threshold resulting from the substrate bias effect developed at the transistors constituting the column decoder.

Furthermore, unlike the methods for lowering only the threshold voltage of the some transistors during manufacturing and for reducing the substrate bias effect through the boost of the gate voltage of the some transistors, there is no need to provide special steps of lowering the threshold voltage and to provide a booster circuit having a large area used to boost the gate voltage, so that increases not only in the size of the semiconductor memory device but its production cost can be suppressed.

DESCRIPTION OF THE EXEMPLARY EMBODIMENTS

First Embodiment

Figure 1:
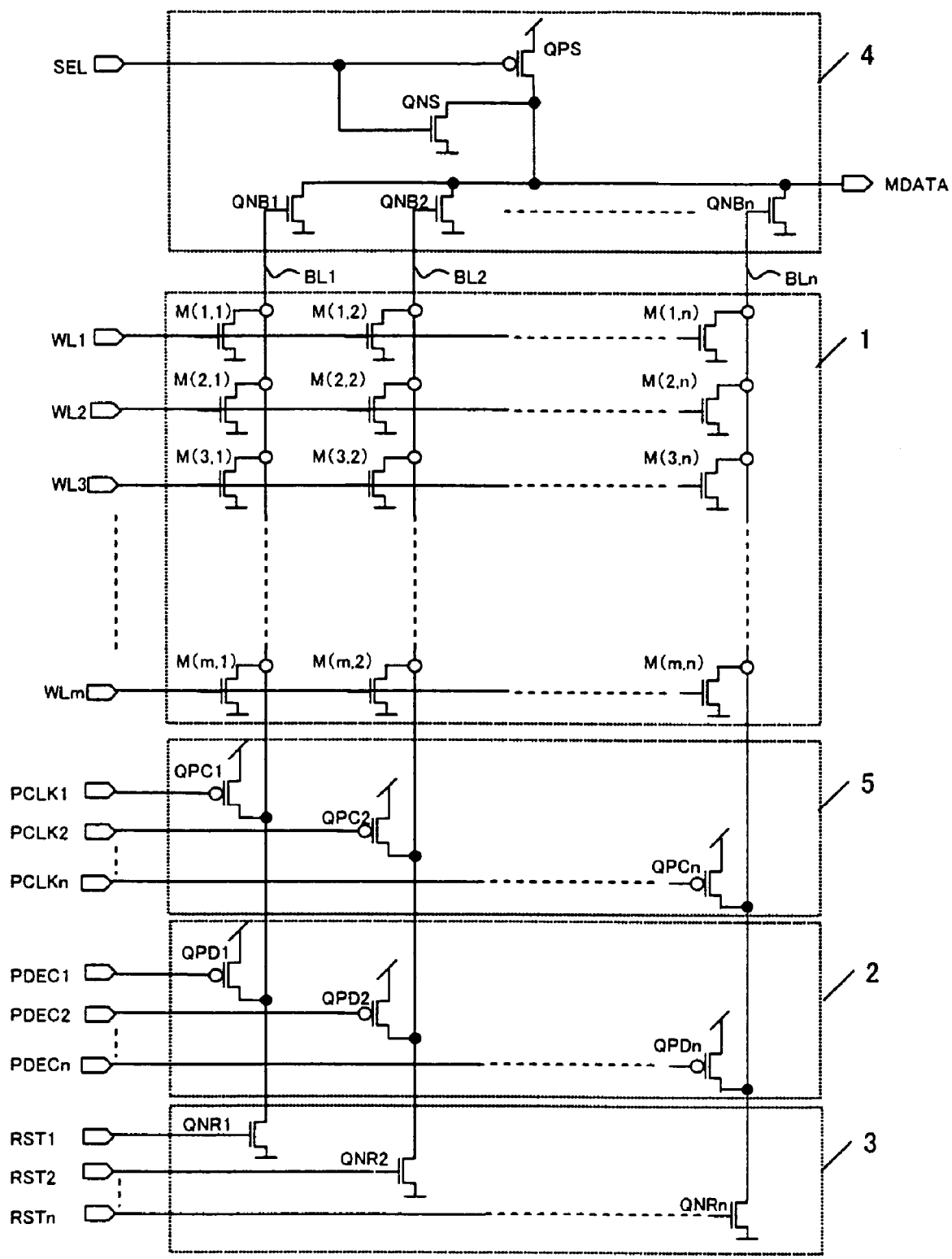
FIG. 1 is a circuit diagram showing the configuration of a semiconductor memory device according to a first embodiment of the present invention.

FIG. 1 is a circuit diagram showing the configuration of a semiconductor memory device according to a first embodiment of the present invention.

The semiconductor memory device shown in FIG. 1 includes a memory cell array 1, a bit line charge circuit 2, a bit line reset circuit 3, a read circuit 4, and a bit line precharge circuit 5.

Since the memory cell array 1 is the same as that of the conventional art semiconductor memory device, the explanation of the same components will be omitted instead of giving the same reference numerals.

The bit line charge circuit 2 includes P-type MOS transistors $QPD_j$ (j=1 to n). With the P-type MOS transistors $QPD_j$ (j=1 to n), their gates are each connected to charge selection signal lines $PDEC_j$ (j=1 to n), their sources are connected to power supply potential lines, and their drains are each connected to bit lines $BL_j$ (j=1 to n).

The ON-state currents of the P-type MOS transistors $QPD_j$ (j=1 to n) are set so as to become smaller than those of memory cells $M(i, j)$ (i=1 to m, and j=1 to n) and to become equal to or larger than the total OFF leakage current of the memory cells aligned on the same bit lines.

The bit line reset circuit 3 includes N-type MOS transistors $QNR_j$ (j=1 to n). As for the N-type MOS transistors $QNR_j$ (j=1 to n), their gates are each connected to reset selection signal lines $RST_j$ (j=1 to n), their sources are connected to a ground potential line, and their drains are each connected to the bit lines $BL_j$ (j=1 to n).

The read circuit 4 includes a P-type MOS transistor QPS, a N-type MOS transistor QNS, and N-type MOS transistors $QNB_j$ (j=1 to n).

With the P-type MOS transistor QPS, its gate is connected to a read signal line SEL, its source is connected to the power supply potential line, and its drain is connected to an output terminal MDATA.

With the N-type MOS transistor QNS, its gate is connected to the read signal line SEL, its source is connected to the ground potential line, and its drain is connected to the output terminal MDATA.

With the N-type MOS transistors $QNB_j$ (j=1 to n), their gates are each connected to the bit lines $BL_j$ (j=1 to n), their sources are connected to the ground potential line, and their drains are connected to the output terminal MDATA.

The bit line precharge circuit 5 includes P-type MOS transistors $QPC_j$ (j=1 to n). As for the P-type MOS transistors $QPC_j$ (j=1 to n), their gates are each connected to precharge selection signal lines $PCLK_j$ (j=1 to n), their sources are connected to the power supply potential line, and their drains are each connected to the bit lines BLj (j=1 to n).

Figure 2:
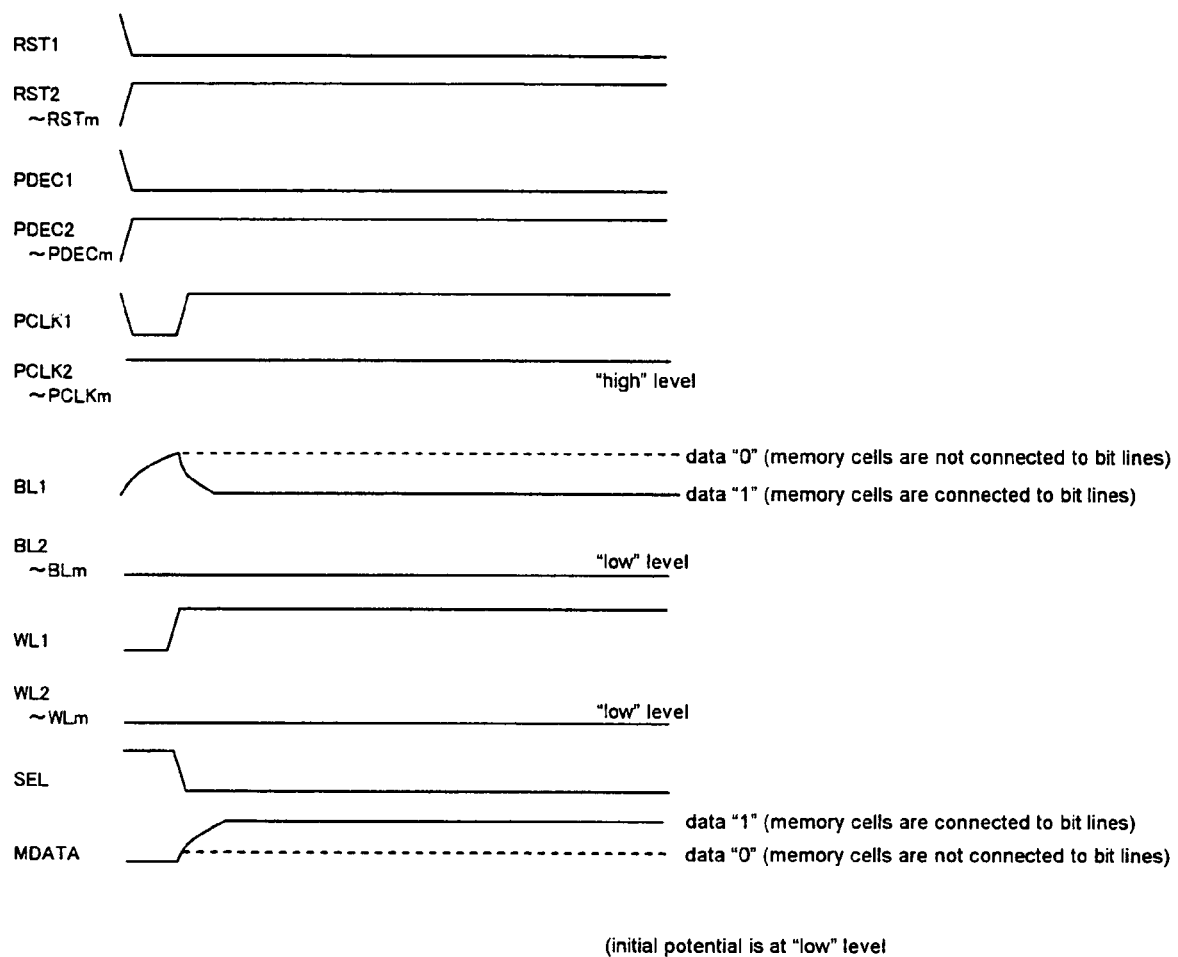
FIG. 2 is a timing chart showing the operation of the semiconductor memory device according to the first embodiment of the invention.

The reading operation of data of, for example, the memory cell M(1, 1) included in the semiconductor memory device having such a configuration will be described with reference to the FIG. 2 timing chart.

Among the reset selection signal lines RSTj (j=1 to n), the reset selection signal line RST1 is brought low, and the reset selection signal lines RST2 to RSTn are brought high. As a result, among the transistors constituting the bit line reset circuit 3, the transistor QNR1 is turned off, and the other transistors QNR2 to QNRn are turned on.

Also, among the charge selection signal lines PDECj (j=1 to n), the charge selection signal line PDEC1 is brought low, and the charge selection signal lines PDEC2 to PDECn are brought high. As a result, among the transistors constituting the bit line charge circuit 2, the transistor QPD1 is turned on, and the other transistors QPD2 to QPDn are turned off.

Besides, the read signal line SEL is brought high, thereby the transistor QNS is turned on, and the transistor QPS is turned off.

Furthermore, all the word lines WL1 to WLm are brought low, thereby all the memory cells M(i, j) (i=1 to m, and j=1 to n) are turned off.

Then, among the precharge control signal lines PCLK1 to PCLKn, the precharge control signal line PCLK1 is brought low for a fixed time period; therefore, the transistor QPC1 is turned on, and the bit line BL1 is charged high. Moreover, the precharge control signal lines PCLK2 to PCLKn become high. Because of this, the transistors QPC2 to QPCn are turned off, and the bit lines BL2 to BLn become low without being charged.

After the bit line BL1 has become high, the word line WL1 is shifted from the low level, which means a non-selected state, to the high level which means a selected state, and the read signal line SEL is brought low.

Because of this, when the drain of the memory cell M(1, 1) is connected to the bit line BL1, electric charge supplied to the bit line BL1 by the transistor QPC1 is discharged by the memory cell M(1, 1), so that the bit line BL1 becomes low. When the drain of the memory cell M(1, 1) is not connected to the bit line BL1, the electric charge supplied to the bit line BL1 by the transistor QPC1 is not discharged by the memory cell M(1, 1), so that the bit line BL1 is held high; in contrast, the bit lines BL2 to BLn become low because the transistors QNR2 to QNRn are on.

As a result, among the transistors QNB1 to QNBn, the transistors QNB2 to QNBn whose gates are each connected with the bit lines BL2 to BLn are turned off.

When the drain of the memory cell M(1, 1) is not connected to the bit line BL1, the bit line BL1 becomes high, so that the transistor QNB1 whose gate is connected with the bit line BL1 is turned on. As a consequence, electric charge supplied to the output terminal MDATA by the transistor QPS, whose gate is connected to the read signal line SEL, is discharged by the transistor QNB1; hence, the output terminal MDATA becomes low.

However, when the drain of the memory cell M(1, 1) is connected to the bit line BL1, the bit line BL1 becomes low, so that the transistor QNB1 is turned off. As a result, the electric charge supplied to the output terminal MDATA by the transistor QPS whose gate is connected with the read signal line SEL is not discharged by the transistor QNB1. Therefore, the output terminal MDATA becomes high.

As described above, according to this embodiment, it is possible to connect the bit lines BLj (j=1 to n) and the read circuit 4 without the use of a column decoder. Because of this, unlike the conventional art semiconductor memory device, reading operation can be performed without the influence of the high threshold resulting from the substrate bias effect produced at from the transistors which constitute the column decoder. The influence of the substrate bias effect becomes great during the reading operation; hence, the reading can be performed even in a low-voltage state in which the reading cannot be performed.

In this embodiment, the bit line precharge circuit 5 is provided to charge the bit lines rapidly; however, when there is no need to charge the bit lines rapidly, the same effects can be achieved even without the provision of the bit line precharge circuit.

Second Embodiment

Figure 3:
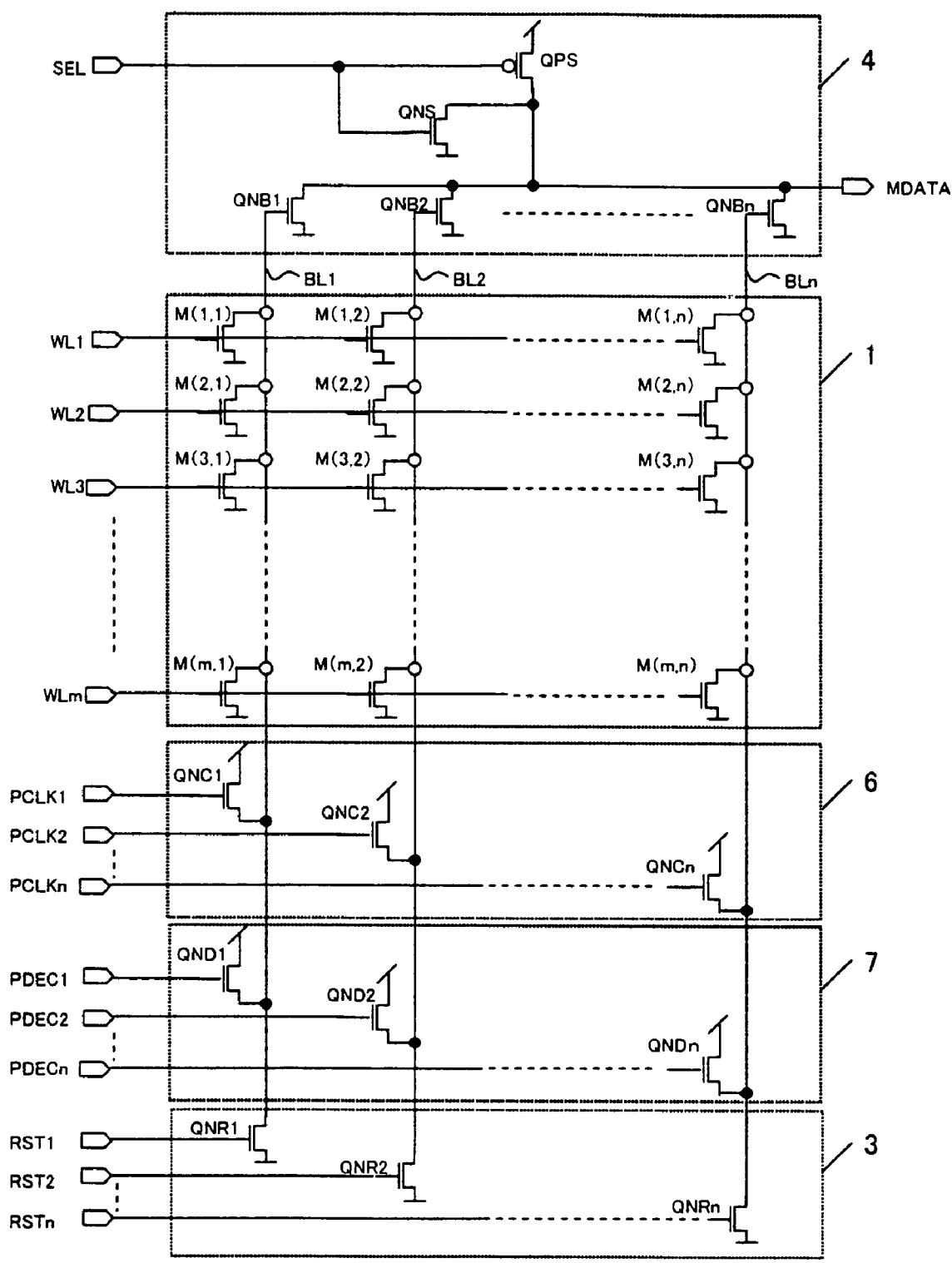
FIG. 3 is a circuit diagram showing the configuration of a semiconductor memory device according to a second embodiment of the invention.

FIG. 3 is a circuit diagram showing the configuration of a semiconductor memory device according to a second embodiment of the invention.

The semiconductor memory device shown in FIG. 3 includes the memory cell array 1, the bit line reset circuit 3, the read circuit 4, a bit line precharge circuit 6, and a bit line charge circuit 7. Since the memory cell array 1, the bit line reset circuit 3, and the read circuit 4 are the same as those described in the first embodiment, the explanation of the same components thereof will be omitted instead of giving the same reference numerals.

The bit line precharge circuit 6 includes N-type MOS transistors QNCj (j=1 to n). As for the N-type MOS transistors QNCj (j=1 to n), their gates are each connected to precharge selection signal lines PCLKj (j=1 to n), their drains are connected to power supply potential lines, and their sources are each connected to bit lines BLj (j=1 to n).

The bit line charge circuit 7 includes N-type MOS transistors QNDj (j=1 to n). As for the N-type MOS transistors QNDj (j=1 to n), their gates are each connected to charge selection signal lines PDECj (j=1 to n), their drains are connected to the power supply potential lines, and their sources are each connected to the bit lines BLj (j=1 to n).

The ON-state currents of the N-type MOS transistors QNDj (j=1 to n) are set so as to become smaller than those of the memory cells M(i, j) (i=1 to m, and j=1 to n) and to become equal to or larger than the total OFF leakage current of the memory cells aligned on the same bit line.

Figure 4:
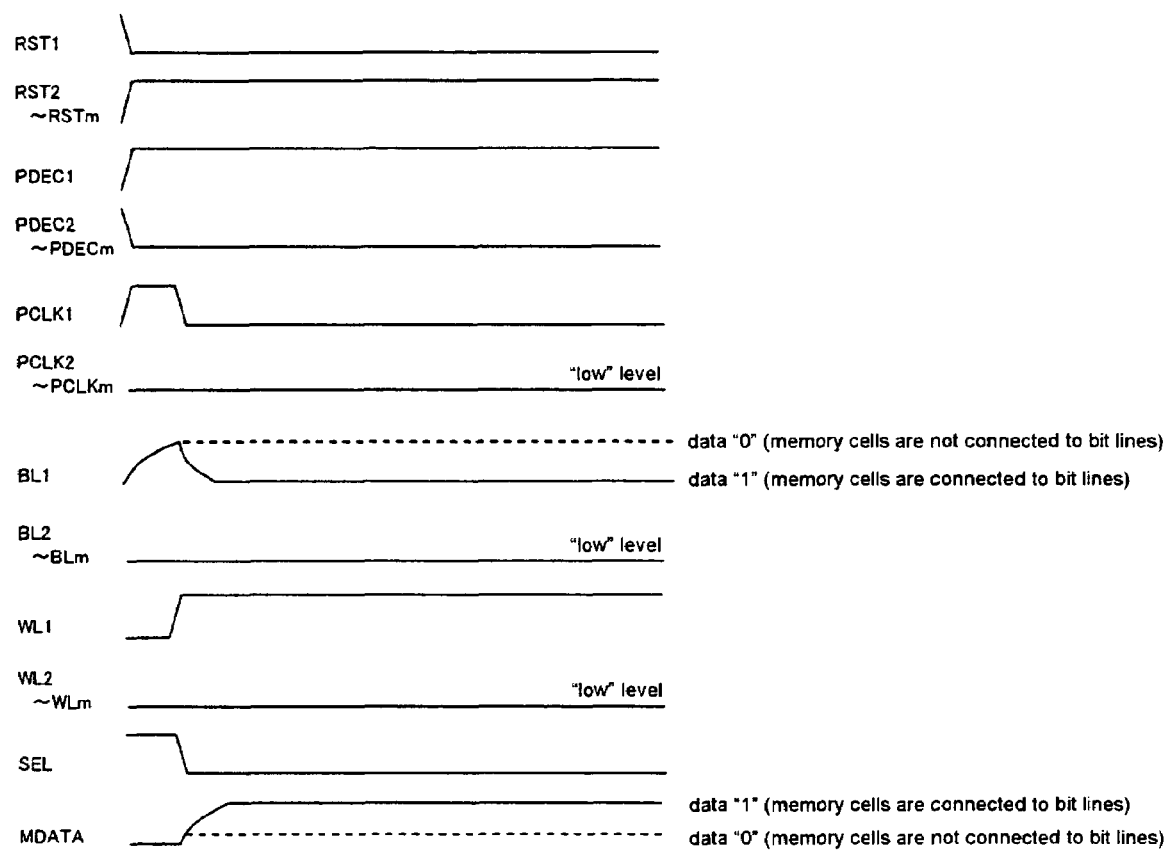
FIG. 4 is a timing chart showing the operation of the semiconductor memory device according to the second embodiment of the invention.

The reading operation of data of, for instance, the memory cell M(1, 1) included in the semiconductor memory device having such a configuration will be described with reference to the FIG. 4 timing chart.

Among the reset selection signal lines RSTj (j=1 to n), the reset selection signal line RST1 is brought low, and the reset selection signal lines RST2 to RSTn are brought high. As a result, among the transistors constituting the bit line reset circuit 3, the transistor QNR1 is turned off, and the other transistors QNR2 to QNRn are turned on.

Besides, among the charge selection signal lines PDECj (j=1 to n), the charge selection signal line PDEC1 is brought high, and the charge selection signal lines PDEC2 to PDECn are brought low. As a consequence, among the transistors constituting the bit line charge circuit 7, the transistor QND1 is turned on, and the other transistors QND2 to QNDn are turned off.

Moreover, the read signal line SEL is brought high, thereby the transistor QNS is turned on, and the transistor QPS is turned off.

Furthermore, all the word lines WL1 to WLm are brought low, thereby all the memory cells M(i, j) (i=1 to m, and j=1 to n) are turned off.

Then, among the precharge control signal lines PCLK1 to PCLKn, the precharge control signal line PCLK1 is brought high for a fixed time period, thereby the transistor QNC1 is turned on, and the bit line BL1 is charged high. In contrast to this, the precharge control signal lines PCLK2 to PCLKn are brought low, thereby the transistors QNC2 to QNCn are turned off, and the bit lines BL2 to BLn become low without being charged.

After the bit line BL1 has become high, the word line WL1 is shifted from the low level, which means the non-selected state, to the high level which means the selected state, and the read signal line SEL is brought low.

As a result, when the drain of the memory cell M(1, 1) is connected to the bit line BL1, electric charge supplied to the bit line BL1 by the transistor QNC1 is discharged by the memory cell M(1, 1), so that the bit line BL1 becomes low. In contrast to this, when the drain of the memory cell M(1, 1) is not connected to the bit line BL1, the electric charge supplied to the bit line BL1 by the transistor QNC1 is not discharged by the memory cell M(1, 1), so that the bit line BL1 is held high, while the bit lines BL2 to BLn become low because the transistors QNR2 to QNRn are on.

As a consequence, among the transistors QNB1 to QNBn, the transistors QNB2 to QNBn whose gates are each connected with the bit lines BL2 to BLn are turned off.

When the drain of the memory cell M(1, 1) is not connected to the bit line BL1, the bit line BL1 becomes high, so that the transistor QNB1 whose gate is connected to the bit line BL1 is turned on. As a result, electric charge supplied to the output terminal MDATA by the transistor QPS, whose gate is connected to the read signal line SEL, is discharged by the transistor QNB1; therefore, the output terminal MDATA is becomes low.

In contrast to this, when the drain of the memory cell M(1, 1) is connected to the bit line BL1, the bit line BL1 becomes low, so that the transistor QNB1 is turned off. As a consequence, the electric charge supplied to the output terminal MDATA by the transistor QPS, whose gate is connected with the read signal line SEL, is not discharged by the transistor QNB1; therefore, the output terminal MDATA becomes high.

As described above, according to this embodiment, it is possible to perform the reading operation even in the low-voltage state as in the case of the first embodiment, and the same effects as those described in the first embodiment can be achieved.

Furthermore, by adopting such a configuration in which the memory cell array 1, the bit line charge circuit 7, the bit line precharge circuit 6, and the bit line reset circuit 3 are constituted by the N-type MOS transistors, the individual circuits can be placed in the same well on the semiconductor substrate; therefore, there is no need to provide regions for well isolation. In addition, since the ON-state current of the N-type MOS transistor is larger than that of the P-type MOS transistor, it is also possible to narrow the width of the transistors constituting the bit line charge circuit 7 and the bit line precharge circuit 6. As a result, the semiconductor memory device having a smaller area can be implemented.

In this embodiment, the bit line precharge circuit 6 is provided to charge the bit lines rapidly; however, when there is no need to charge the bit lines rapidly, the same effects can be achieved even without the provision of the bit line precharge circuit.

Third Embodiment

Figure 5:
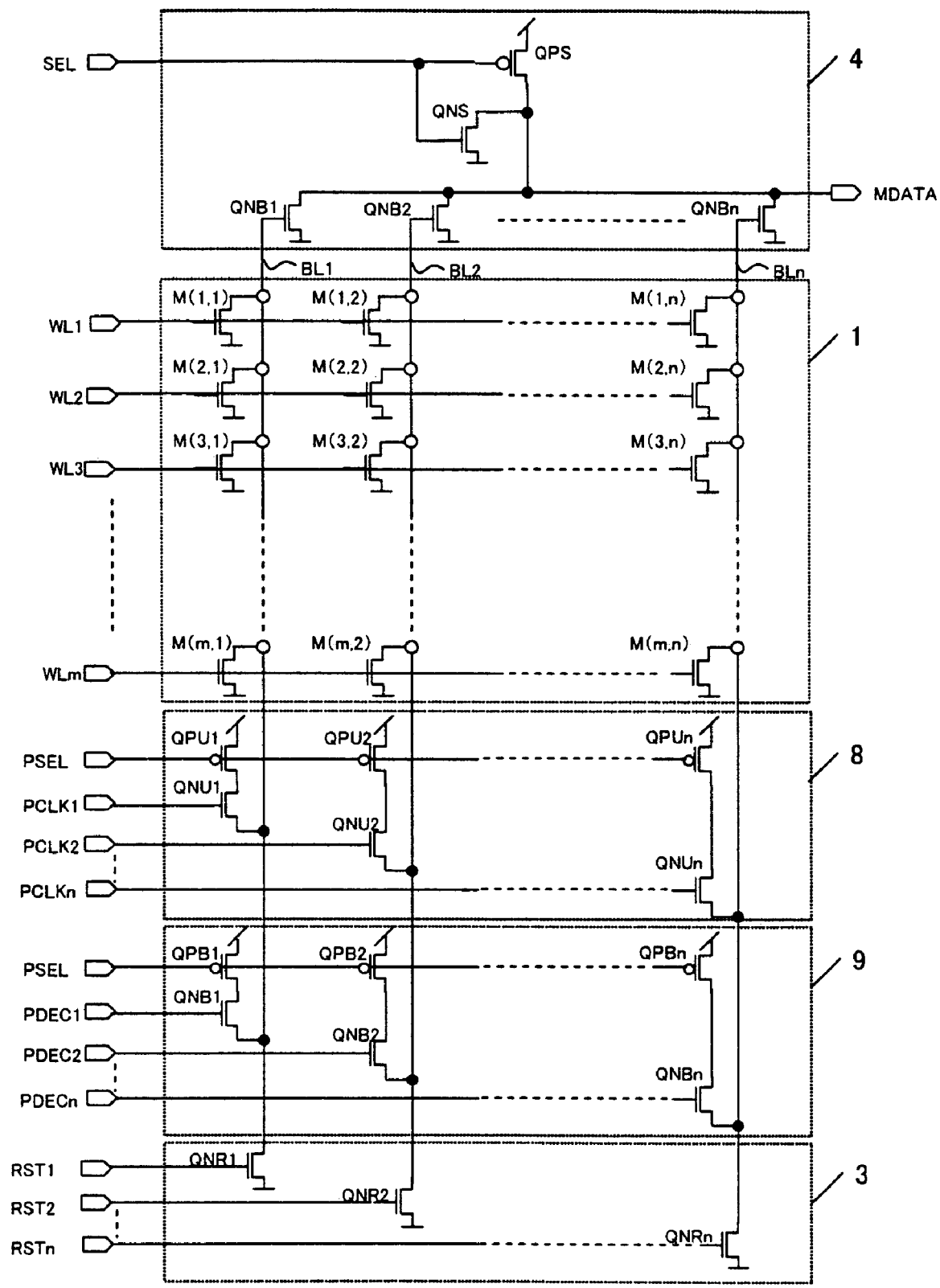
FIG. 5 is a circuit diagram showing the configuration of a semiconductor memory device according to a third embodiment of the invention.
Figure 6:
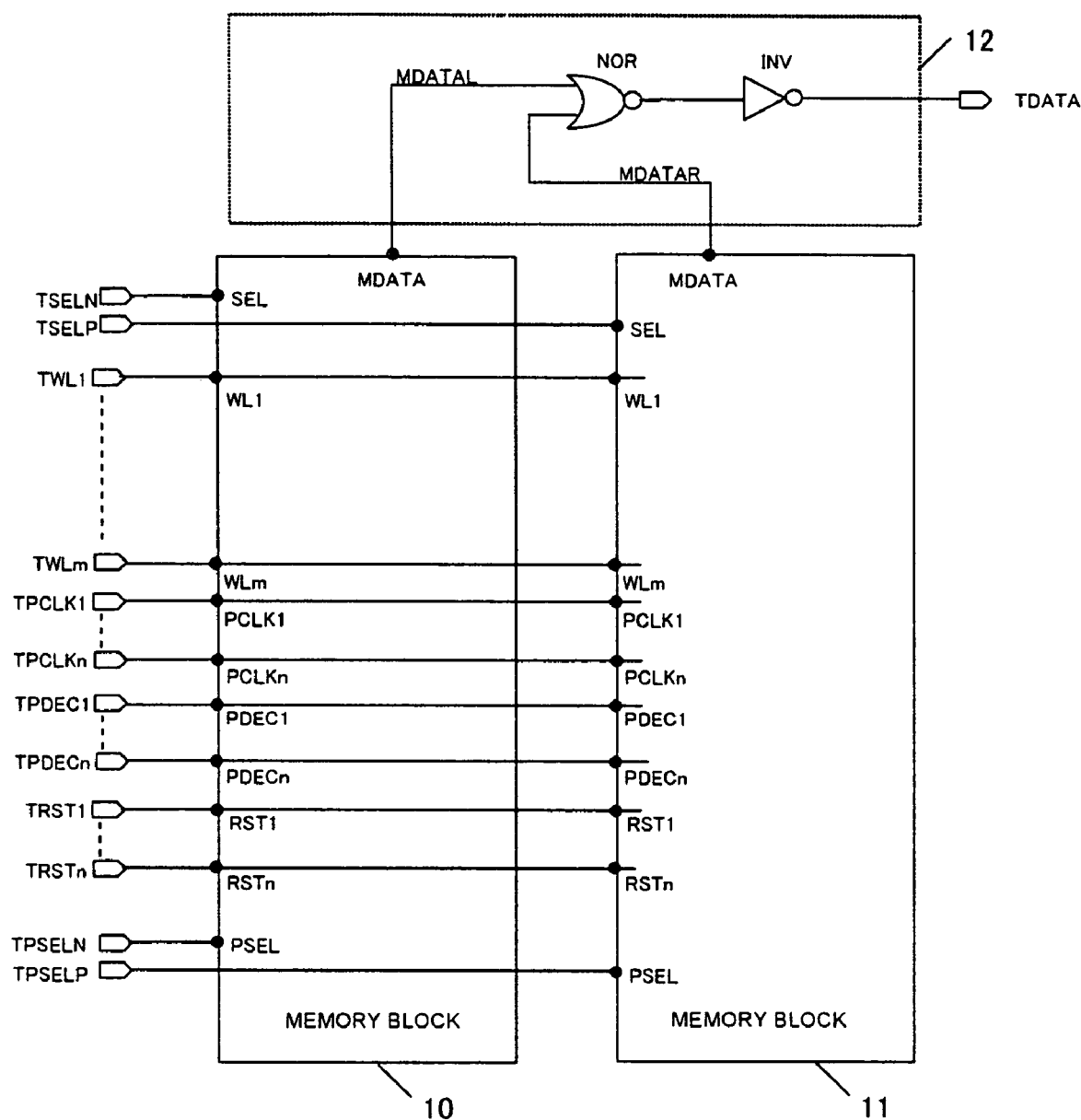
FIG. 6 is a circuit diagram showing the configuration of the semiconductor memory device according to the third embodiment of the invention.

FIGS. 5 and 6 are circuit diagrams showing the configuration of a semiconductor memory device according to a third embodiment of the invention.

As shown in FIG. 6, the semiconductor memory device according to the fourth embodiment includes a memory block 10, a memory block 11, and an output selection circuit 12.

As shown in FIG. 5, the memory blocks 10 and 11 are each constituted by the memory cell array 1, the bit line reset circuit 3, the read circuit 4, a bit line precharge circuit 8, and a bit line charge circuit 9. Since the memory cell array 1, the bit line reset circuit 3, and the read circuit 4 are the same as those described in the first embodiment, the explanation of the same components thereof will be omitted instead of giving the same reference numerals.

The bit line precharge circuit 8 includes P-type MOS transistors QPUj (j=1 to n) and N-type MOS transistors QNUj (j=1 to n).

As for the P-type MOS transistors QPUj (j=1 to n), their gates are connected to a block selection signal line PSEL, their sources are connected to power supply potential lines, and their drains are each connected to the drains of the N-type MOS transistors QNUj (j=1 to n).

As for the N-type MOS transistors QNUj (j=1 to n), their gates are each connected to precharge selection signal lines PCLKj (j=1 to n), their sources are each connected to the bit lines BLj (j=1 to n), and their drains are each connected to the drains of the P-type MOS transistors QPUj (j=1 to n).

The bit line charge circuit 9 includes P-type MOS transistors QPBj (j=1 to n) and N-type MOS transistors QNBj (j=1 to n).

As for the P-type MOS transistors QPBj (j=1 to n), their gates are connected to a block selection signal line PSEL, their sources are connected to the power supply potential lines, and their drains are each connected to the drains of the N-type MOS transistors QNBj (j=1 to n).

As for the N-type MOS transistors QNBj (j=1 to n), their gates are each connected to charge selection signal lines PDECj (j=1 to n), their sources are each connected to the bit lines BLj (j=1 to n), and their drains are each connected to the drains of the P-type MOS transistors QPBj (j=1 to n).

As described above, the P-type MOS transistors QPBj (j=1 to n) are each connected in series with the N-type MOS transistors QNBj (j=1 to n) between the power supply potential lines and the bit lines BLj (j=1 ton). Electric currents flowing through the P-type MOS transistors QPBj (j=1 to n) and the N-type MOS transistors QNBj (j=1 to n) are set so as to become smaller than the ON-state currents of the memory cells M(i, j) (i=1 to m, and j=1 to n) and to become equal to or larger than the total OFF leakage current of the memory cells aligned on the same bit lines.

The memory blocks 10 and 11 have such a configuration respectively.

With the memory block 10, as shown in FIG. 6, a read signal line SEL is connected to a read signal terminal TSELN, and the word lines WLi (i=1 to m) are connected to word line terminals TWLi (i=1 to m). And further, the precharge selection signal lines PCLKj (j=1 to n) are connected to precharge selection signal terminals TPCLKj (j=1 to n), and the charge selection signal lines PDECj (j=1 to n) are connected to charge selection signal terminals TPDECj (j=1 to n). Still further, the reset selection signal lines RSTj (j=1 to n) are connected to reset selection signal terminals TRSTj (j=1 ton), the block selection signal line PSEL is connected to a block selection signal terminal TPSELN, and the output terminal MDATA is connected to an output signal line MDATAL.

With the memory block 11, the read signal line SEL is connected to a read signal terminal TSELP, and the word lines WLi (i=1 to m) are connected to the word line terminals TWLi (i=1 to m). Further, the precharge selection signal lines PCLKj (j=1 to n) are connected to the precharge selection signal terminals TPCLKj (j=1 to n), and the charge selection signal lines PDECj (j=1 to n) are connected to the charge selection signal terminals TPDECj (j=1 to n). Still further, the reset selection signal lines RSTj (j=1 ton) are connected to the reset selection signal terminals TRSTj (j=1 ton), the block selection signal line PSEL is connected to a block selection signal terminal TPSELP, and the output terminal MDATA is connected to an output signal line MDATAR.

The output selection circuit 12 includes a NOT-OR element NOR and an inverter INV.

With the NOT-OR element NOR, one input end is connected to the output signal line MDATAL, the other is connected to the output signal line MDATAR, and an output end is connected to the input end of the inverter INV.

With the inverter INV, its input end is connected to the output end of the NOT-OR element NOR and its output end is connected to an output terminal TDATA.

Figure 7:
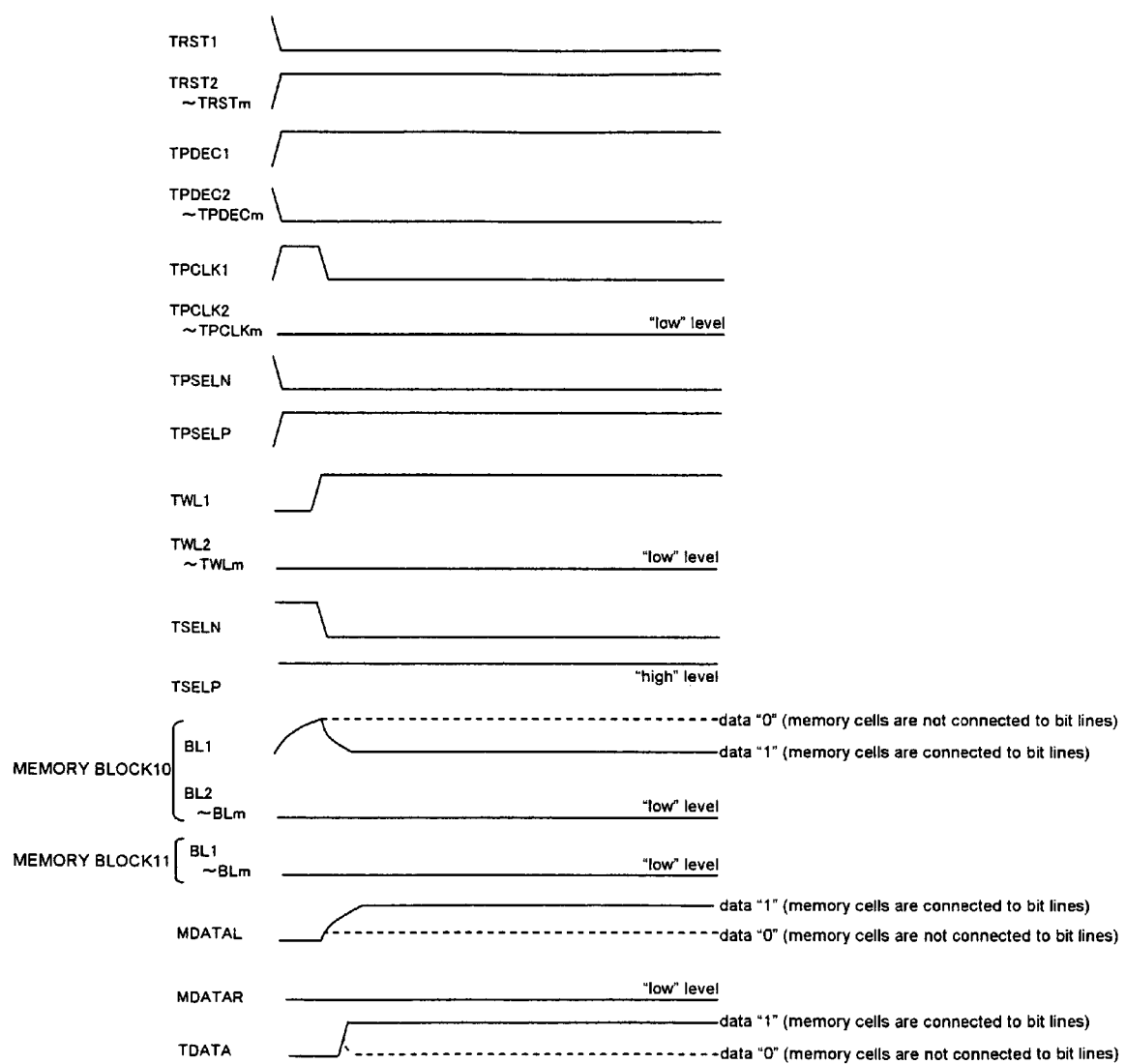
FIG. 7 is a timing chart showing the operation of the semiconductor memory device according to the third embodiment of the invention.

The reading operation of data of, for instance, the memory cell M(1, 1) in the memory block 10 included in the semiconductor memory device having such a configuration will be described with reference to the FIG. 7 timing chart.

Among the reset selection signal terminals TRSTj (j=1 to n), the reset selection signal terminal TRST1 is brought low, and the reset selection signal terminals TRST2 to TRSTn are brought high; hence, among the reset selection signal lines RSTj (j=1 to n) of the memory blocks 10 and 11, the reset selection signal line RST1 is brought low, and the reset selection signal lines RST2 to RSTn are brought high. As a result, among the transistors constituting the bit line reset circuits 3, the transistors QNR1 are turned off, and the other transistors QNR2 to QNRn are turned on.

Furthermore, among the charge selection signal terminals TPDECj (j=1 to n), the charge selection signal terminal TPDEC1 is brought high, and the charge selection signal terminals TPDEC2 to TPDECn are brought low; hence, the charge selection signal line PDEC1 of the memory blocks 10 and 11 is brought high, and their charge selection signal lines PDEC2 to PDECn are brought low. As a consequence, among the transistors constituting the bit line charge circuit 9, the transistors QNB1 are turned on, and the other transistors QNB2 to QNBn are turned off.

Then the read signal terminals TSELN and TSELP are brought high, thereby the read signal lines SEL of the memory blocks 10 and 11 are brought high. As a result, the transistors QNS of the memory blocks 10 and 11 are turned on, and their transistors QPS are turned off.

Also, the block selection signal terminal TPSELN is brought low, thereby the block selection signal line PSEL of the memory block 10 becomes low. As a consequence, the transistors QPUj (j=1 to n) constituting the bit line precharge circuit 8 and the transistors QPBj (j=1 to n) constituting the bit line charge circuit 9 are turned on. Moreover, the block selection signal terminal TPSELP is brought high, thereby the block selection signal line PSEL of the memory block 11 becomes high. As a result, the transistors QPUj (j=1 to n) constituting the bit line precharge circuit 8 and the transistors QPBj (j=1 to n) constituting the bit line charge circuit 9 are turned off.

Furthermore, all the word line terminals TWL1 to TWLm are brought low, thereby the word lines WL1 to WLm of the memory blocks 10 and 11 are brought low to turn off all the memory cells M(i, j) (i=1 to m, and j=1 to n).

Then, among the precharge control signal terminals TPCLK1 to TPCLKn, the precharge control signal terminal TPCLK1 is brought high for a fixed time period, thereby the precharge control signal line PCLK1 of the memory blocks 10 and 11 becomes high for a fixed time period to turn on the transistors QNU1 for a fixed time period.

Also, the precharge control signal terminals TPCLK2 to TPCLKn are brought low, and the precharge control signal lines PCLK2 to PCLKn are brought low.

Because of this, the transistors QNU2 to QNUn are turned off; therefore, the bit line BL1 of the memory block 10 is charged high and its bit lines BL2 to BLn become low without being charged. Moreover, the bit line BL1 of the memory cell 11 is brought to a floating state without being charged, and its bit lines BL2 to BLn become low without being charged.

After the bit line BL1 of the memory block 10 has become high, the word line terminal TWL1 is shifted from the low level, which means a non-selected state, to the high level which means a selected state. Furthermore, the read signal terminal TSELN is brought low, and the read signal line SEL of the memory block 10 is brought low.

As a consequence, when the drain of the memory cell M(1, 1) in the memory block 10 is connected to the bit line BL1, electric charge supplied to the bit line BL1 by the transistors QPU1 and QNU1 is discharged by the memory cell M(1, 1), so that the bit line BL1 becomes low. In contrast to this, when the drain of the memory cell M(1, 1) in the memory block 10 is not connected to the bit line BL1, the electric charge supplied to the bit line BL1 by the transistors QPU1 and QNU1 is not discharged by the memory cell M(1, 1), so that the bit line BL1 is held high; the bit lines BL2 to BLn of the memory cell block 10 become low because the transistors QNR2 to QNRn are on.

Because of this, among the transistors QNB1 to QNBn of the read circuit 4 in the memory block 10, the transistors QNB2 to QNBn whose gates are each connected with the bit lines BL2 to BLn are turned off. In addition, when the drain of the memory cell M(1, 1) is not connected to the bit line BL1, the bit line BL1 becomes high, so that the transistor QNB1 whose gate is connected to the bit line BL1 is turned on. As a result, electric charge supplied to the output terminal MDATA by the transistor QPS whose gate is connected to the read signal line SEL is discharged by the transistor QNB1, so that the output signal line MDATAL connected to the output terminal MDATA becomes low. In contrast to this, when the drain of the memory cell M(1, 1) is connected to the bit line BL1, the bit line BL1 becomes low. As a consequence, the electric charge supplied to the output terminal MDATA by the transistor QPS whose gate is connected with the read signal line SEL is not discharged by the transistor QNB1, so that the output signal line MDATAL connected with the output terminal MDATA becomes high.

As for the memory block 11, the read signal terminal TSELP and the read signal line SEL are high, and the output terminal MDATA and the output signal line MDATAR connected with each other are low.

Because of this, when the drain of the memory cell M(1, 1) in the memory cell block 10 is not connected to the bit line BL1, the NOT-OR element NOR in the output selection circuit 12 inputs a high-level signal to the inverter INV, and the inverter INV outputs a low-level signal to the output terminal TDATA. In contrast to this, when the drain of the memory cell M(1, 1) in the memory cell block 10 is connected to the bit line BL1, the NOT-OR element NOR in the output selection circuit 12 inputs a low-level signal to the inverter INV, and the inverter INV outputs a high-level signal to the output terminal TDATA.

As described above, according to this embodiment, it is possible to perform reading operation even in a low-voltage state as in the case of the first embodiment, and the same effects as those described in the first embodiment can be achieved.

Moreover, by controlling the bit line charge circuit 9 and the bit line precharge circuit 8 at each memory block, the bit lines can be selectively charged at each memory block. Because of this, at the memory block where reading is not performed, the charging to the bit lines can be stopped, so that it is possible to reduce power consumption.

In this embodiment, the P-type MOS transistors and the N-type MOS transistors constitute the bit line charge circuit 9 and the bit line precharge circuit 8; however, even when only P-type or N-type MOS transistors constitute them, the same effects can be achieved.

Furthermore, at the bit line charge circuit 9 according to this embodiment, the transistors QPBj (j=1 to n), whose gates are connected to the block selection signal line PSEL, are connected to the power supply potential lines, and the transistors QNBj (j=1 to n), whose gates are connected to the charge selection signal lines PDECj (j=1 to n), are connected to the bit lines. However, even when the transistors QPBj (j=1 to n) and the transistors QNBj (j=1 to n) are interchanged in such a manner that the transistors QPBj (j=1 to n) are connected to the bit lines and the transistors QNBj (j=1 ton) are connected to the power supply potential lines, the same effects can be achieved. Likewise, at the bit line precharge circuit 8 too, even when the transistors QPUj (j=1 to n), whose gates are connected to the block selection signal line PSEL, and the transistors QNUj (j=1 to n), whose gates are connected to the precharge selection signal lines PCLKj (j=1 to n), are interchanged between the power supply potential lines and the bit lines, the same effects can be achieved.

Fourth Embodiment

Figure 8:
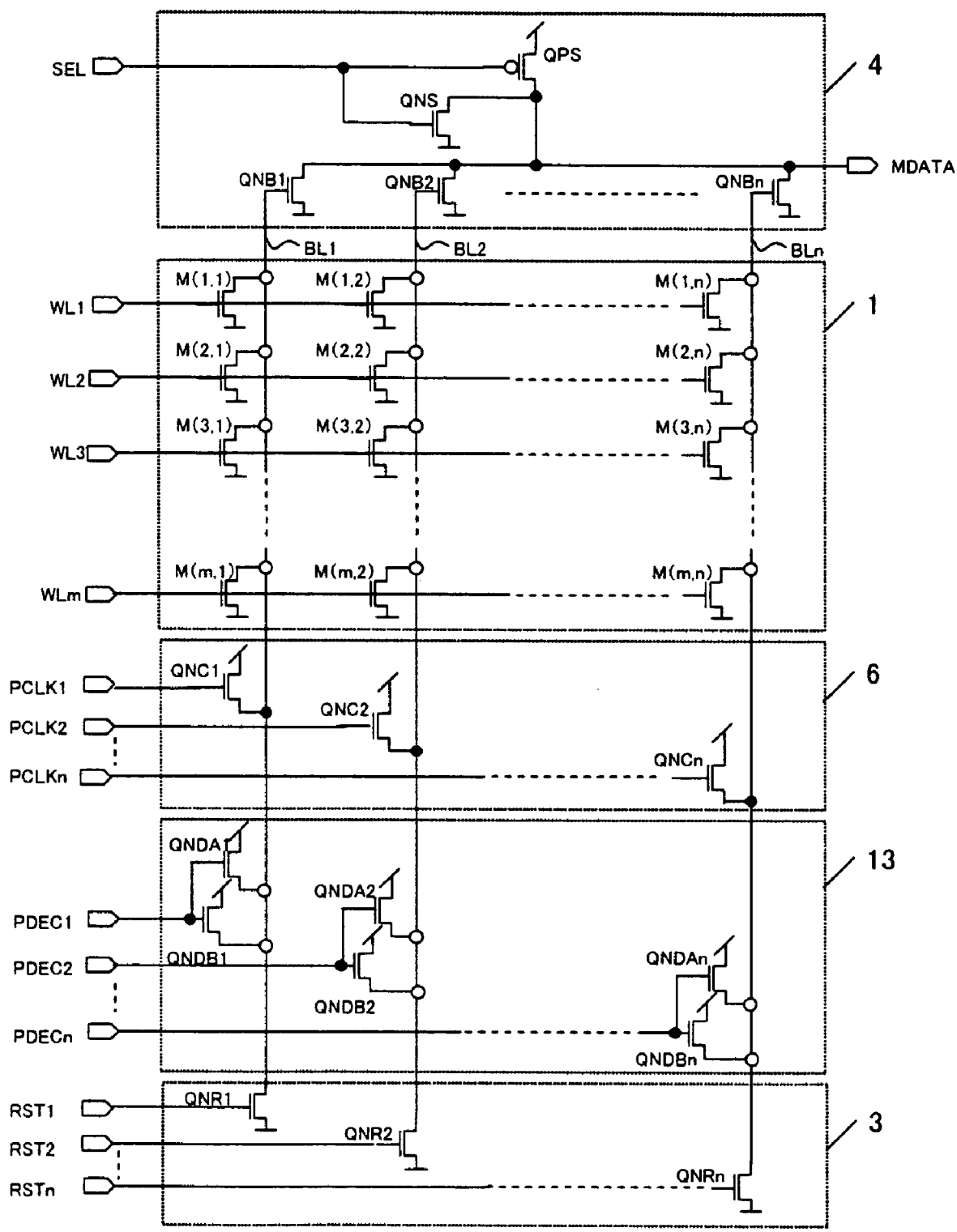
FIG. 8 is a circuit diagram showing the configuration of a semiconductor memory device according to a fourth embodiment of the invention.

FIG. 8 is a circuit diagram showing the configuration of a semiconductor memory device according to a fourth embodiment of the invention.

The semiconductor memory device shown in FIG. 8 includes the memory cell array 1, the bit line reset circuit 3, the read circuit 4, the bit line precharge circuit 6, and a bit line charge circuit 13. Since the memory cell array 1, the bit line reset circuit 3, the read circuit 4, and the bit line precharge circuit 6 are the same as those described in the second embodiment, the explanation of the same components thereof will be omitted instead of giving the same reference numerals.

The bit line charge circuit 13 includes N-type MOS transistors QNDAj (j=1 to n) and N-type MOS transistors QNDBj (j=1 to n).

With the N-type MOS transistors QNDAj (j=1 to n) and QNDBj (j=1 to n), their gates are each connected to charge selection signal lines PDECj (j=1 to n), and their drains are connected to power supply potential lines. The sources of the N-type MOS transistors QNDAj (j=1 to n) and QNDBj (j=1 to n) are set in such a manner that the sources of the transistors QNDAj (j=1 to n) or the sources of the transistors QNDBj (j=1 to n) are connected to the bit lines BLj (j=1 to n) and the sources not connected to the bit lines BLj (j=1 to n) are in a floating state. The N-type MOS transistors QNDAj (j=1 to n) and the N-type MOS transistors QNDBj (j=1 to n) differ in the amount of their ON-state current; the transistors QNDAj (j=1 to n) and QNDBj (j=1 to n) are provided in such a manner that the ON-state currents of the transistors QNDAj (j=1 to n) or the ON-state currents of the transistors QNDBj (j=1 to n) become large.

The ON-state currents of both the N-type MOS transistors QNDAj (j=1 to n) and the N-type MOS transistors QNDBj (j=1 to n) are set so as to become smaller than those of the memory cells M(i, j) (i=1 to m, and j=1 to n) and to become equal to or larger than the total OFF leakage current of the memory cells aligned on the same bit lines.

Figure 9:
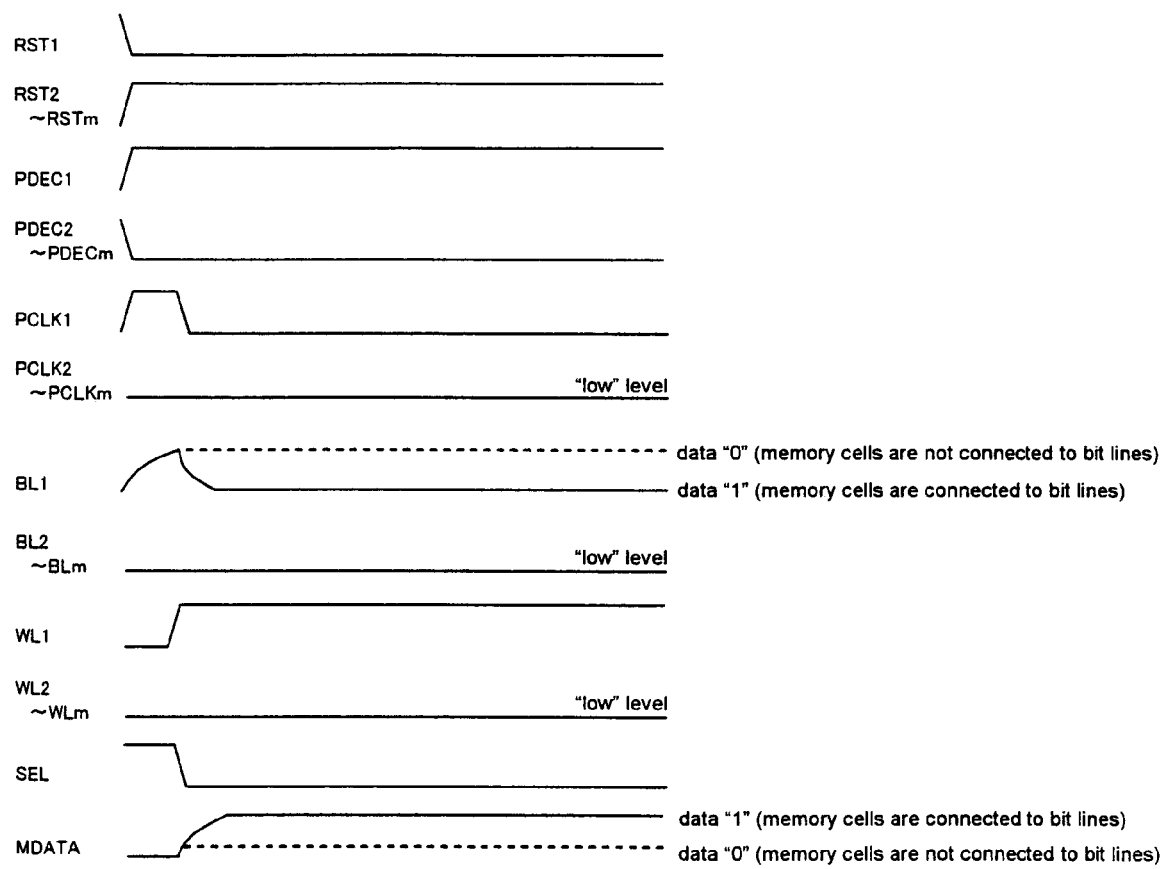
FIG. 9 is a timing chart showing the operation of the semiconductor memory device according to the fourth embodiment of the invention.

The reading operation of data of, for instance, the memory cell M(1, 1) included in the semiconductor memory device having such a configuration will be described with reference to the FIG. 9 timing chart.

Among the reset selection signal lines RSTj (j=1 to n), the reset selection signal line RST1 is brought low and the reset selection signal lines RST2 to RSTn are brought high. As a result, among the transistors constituting the bit line reset circuit 3, the transistor QNR1 is turned off and the other transistors QNR2 to QNRn are turned on. Moreover, among the charge selection signal lines PDECj (j=1 to n), the charge selection signal line PDEC1 is brought high and the charge selection signal lines PDEC2 to PDECn are brought low. As a consequence, among the transistors constituting the bit line charge circuit 13, the transistors QNDA1 and QNDB1 are turned on and the other transistors QNDA2 to QNDAn and QNDB2 to QNDBn are turned off. Further, the read signal line SEL is brought high, the transistor QNS is turned on, and the transistor QPS is turned off. Still further, all the word lines WL1 to WLm are brought low and all the memory cells M(i, j) (i=1 to m, and j=1 to n) are turned off.

Then, among the precharge control signal lines PCLK1 to PCLKn, the precharge control signal line PCLK1 is brought high for a fixed time period, thereby the transistor QNC1 is turned on and the bit line BL1 is charged high. In contrast to this, the precharge control signal lines PCLK2 to PCLKn are brought low, thereby the transistors QNC2 to QNCn are turned off and the bit lines BL2 to BLn become low without being charged.

After the bit line BL1 has become high, the word line WL1 is shifted from the low level, which means a non-selected state, to the high level, which means a selected state, and the read signal line SEL is brought low.

Therefore, when the drain of the memory cell M(1, 1) is connected to the bit line BL1, electric charge supplied to the bit line BL1 by the transistor QNC1 is discharged by the memory cell M(1, 1), so that the bit line BL1 becomes low. In contrast to this, when the drain of the memory cell M(1, 1) is not connected to the bit line BL1, the electric charge supplied to the bit line BL1 by the transistor QNC1 is not discharged by the memory cell M(1, 1), so that the bit line BL1 is held high; the bit lines BL2 to BLn become low because the transistors QNR2 to QNRn are on.

As a consequence, among the transistors QNB1 to QNBn, the transistors QNB2 to QNBn whose gates are each connected with the bit lines BL2 to BLn are turned off. When the drain of the memory cell M(1, 1) is not connected to the bit line BL1, the bit line BL becomes high, so that the transistor QNB1 whose gate is connected with the bit line BL1 is turned on. As a result, electric charge supplied to the output terminal MDATA by the transistor QPS, whose gate is connected to the read signal line SEL, is discharged by the transistor QNB1, so that the output terminal MDATA becomes low. In contrast to this, when the drain of the memory cell M(1, 1) is connected to the bit line BL1, the bit line BL1 becomes low, so that the transistor QNB1 is turned off. As a consequence, the electric charge supplied to the output terminal MDATA by the transistor QPS, whose gate is connected to the read signal line SEL, is not discharged by the transistor QNB1, so that the output terminal MDATA becomes high.

As described above, according to this embodiment, the reading operation can be performed even in a low-voltage state as in the case of the second embodiment, and the same effects as those described in the second embodiment can be achieved.

And furthermore, when the memory cells whose drains are connected to each bit line are high in number, the OFF leakage current developed at the bit line becomes large as well. Because of this, with the bit line charge circuit 13, of the two transistors QNDAj (j=1 to n) and QNDBj (j=1 to n) provided to each bit line, the transistor having a larger ON-state current is selected, and then the transistor selected is connected to the bit line by using the same mask as that used for connecting the drains of the memory cells and the bit lines. In contrast, when the memory cells whose drains are connected to each bit line are low in number, the OFF leakage current developed at the bit line becomes small as well. Because of this, with the bit line charge circuit 13, of the two transistors QNDAj (j=1 to n) and QNDBj (j=1 to n) provided to each bit line, the transistor having a smaller ON-state current is selected, and then the transistor selected is connected to the bit line by using the same mask as that used for connecting the drains of the memory cells and the bit lines.

As described above, the transistors QNDAj (j=1 to n) and QNDBj (j=1 to n) can be selectively connected to the bit lines, so that electric charge supplied to the bit lines by the bit line charge circuit 13 is not supplied to an excessive degree in relation to the electric charge discharged from the bit lines as the OFF leakage current. Because of this, when the drains of the memory cells at which reading is performed are connected to the bit lines, the amount of the electric charge discharged can be reduced. As a consequence, it becomes possible to shorten the discharging time and to effect a high-speed reading operation.

The bit line charge circuit 13 according to the fourth embodiment is constituted by the N-type MOS transistors, while even by P-type MOS transistors, the same effect can be achieved. Furthermore, with the bit line charge circuit 13 described in this embodiment, although either the transistor QNDAj (j=1 to n) or the transistor QNDBj (j=1 to n) is connected to each bit line, even when both transistors QNDAj (j=1 to n) and QNDBj (j=1 to n) are connected to each bit line in response to the OFF leak current developed at the bit line, the same effect can be achieved.

Fifth Embodiment

Figure 10:
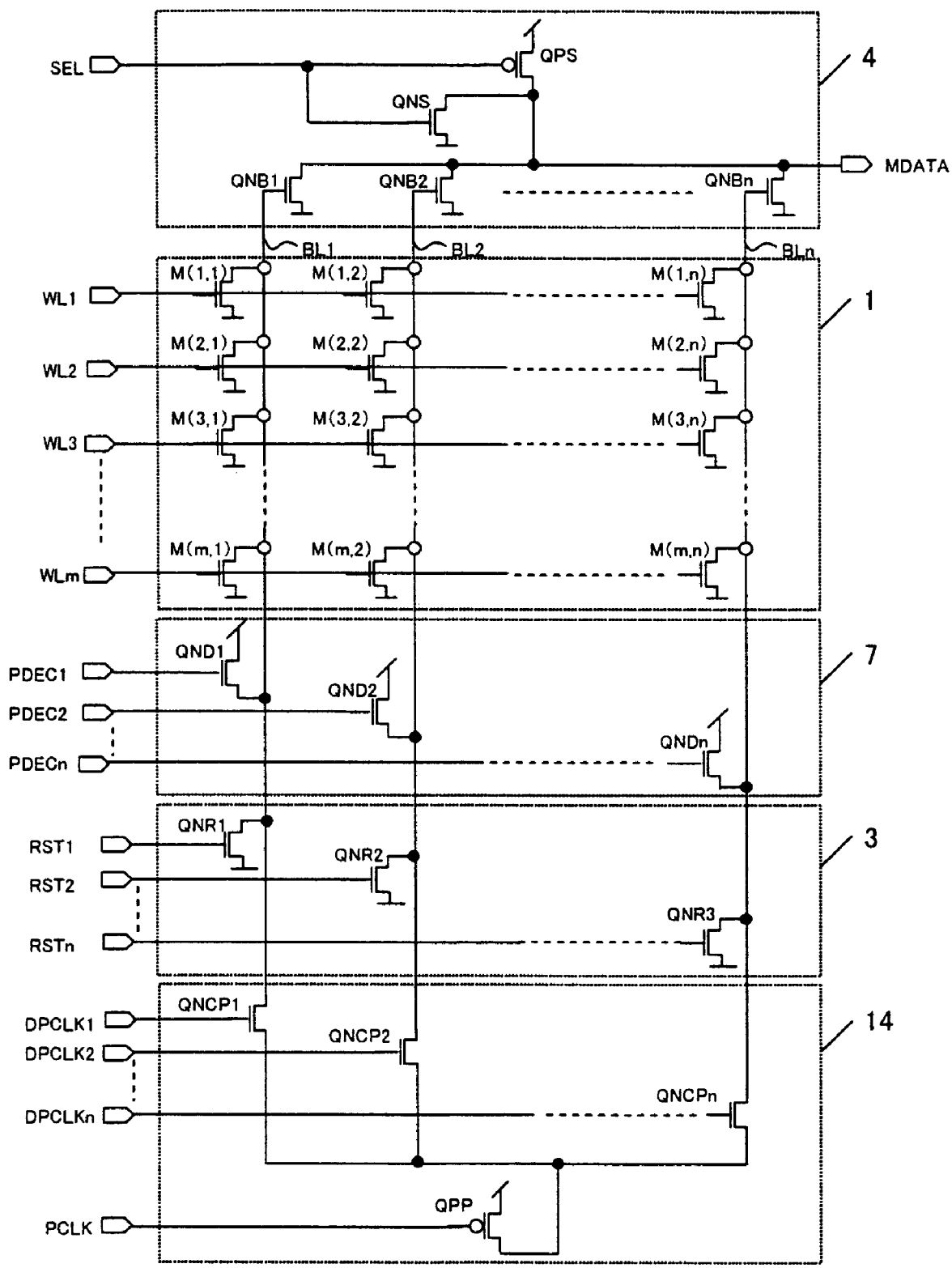
FIG. 10 is a circuit diagram showing the configuration of a semiconductor memory device according to a fifth embodiment of the invention.

FIG. 10 is a circuit diagram showing the configuration of a semiconductor memory device according to a fifth embodiment of the invention.

The semiconductor memory device shown in FIG. 10 includes the memory cell array 1, the bit line reset circuit 3, the read circuit 4, the bit line charge circuit 7, and a bit line precharge circuit 14. Since the memory cell array 1, the bit line reset circuit 3, the read circuit 4, and the bit line charge circuit 7 are the same as those described in the second embodiment, the explanation of the same components thereof will be omitted instead of giving the same reference numerals.

The bit line precharge circuit 14 includes N-type MOS transistors QNCPj (j=1 to n) and P-type MOS transistor QPP.

As for the N-type MOS transistors QNCPj (j=1 to n), their gates are each connected to precharge selection signal lines DPCLKj (j=1 to n), their sources are each connected to the bit lines BLj (j=1 to n), and their drains are connected to the drain of the P-type MOS transistor QPP.

As for the P-type MOS transistor QPP, its gate is connected to a precharge signal line PCLK, its source is connected to a power supply potential line, and its drain is connected to the drains of the N-type MOS transistors QNCPj (j=1 to n).

Figure 11:
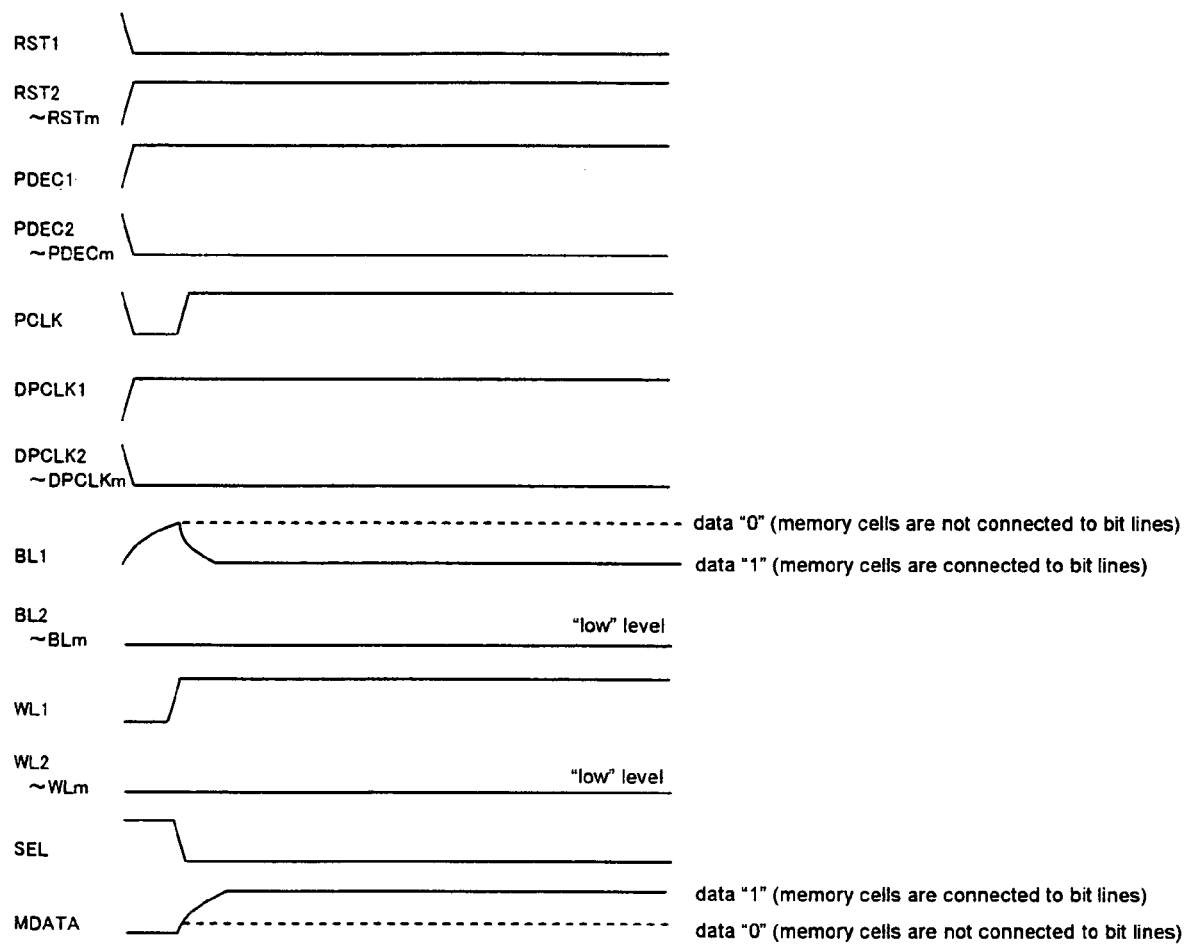
FIG. 11 is a timing chart showing the operation of the semiconductor memory device according to the fifth embodiment of the invention.
Figure 12:
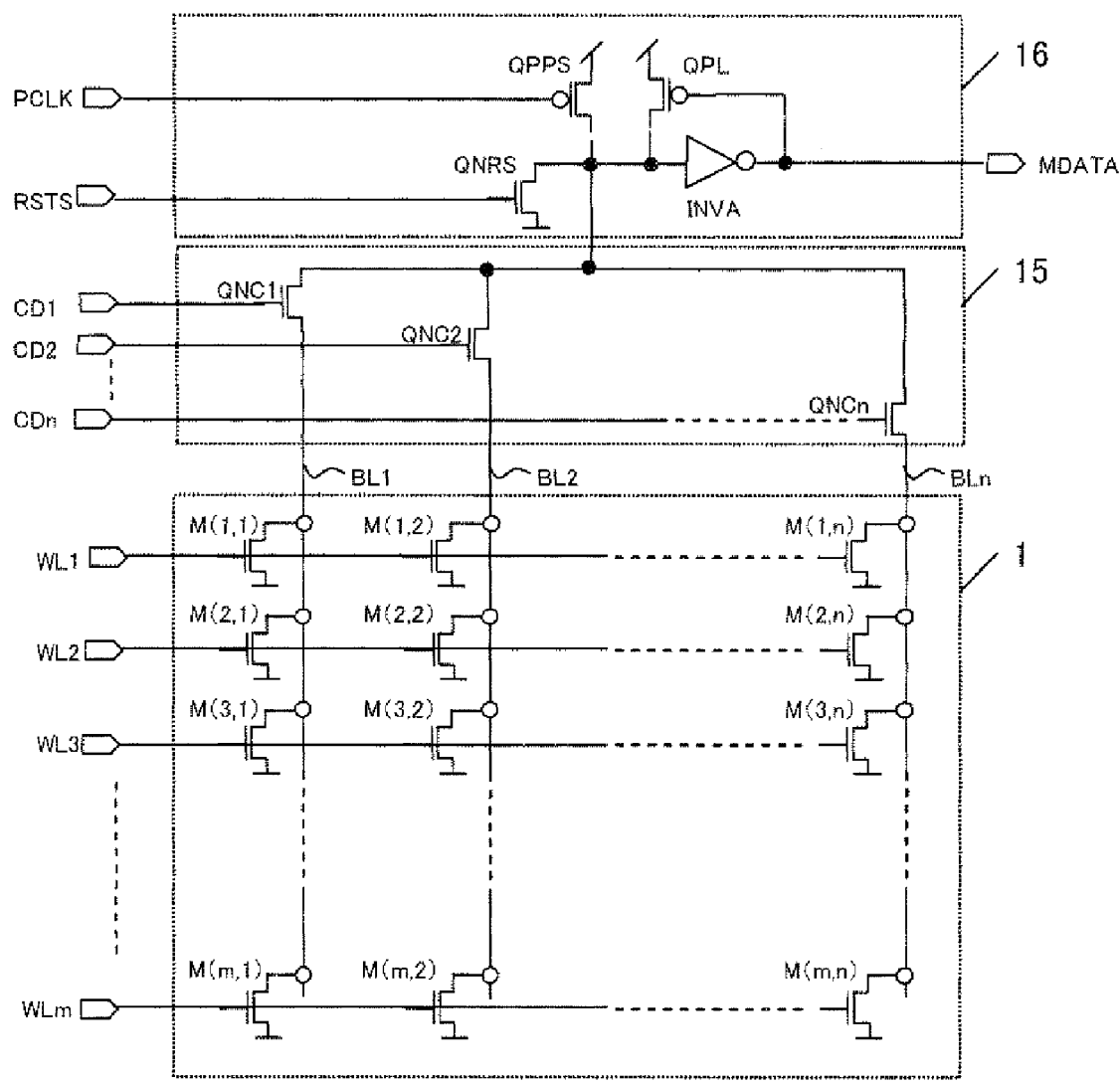
FIG. 12 is a circuit diagram showing the configuration of the conventional art semiconductor memory device.
Figure 13:
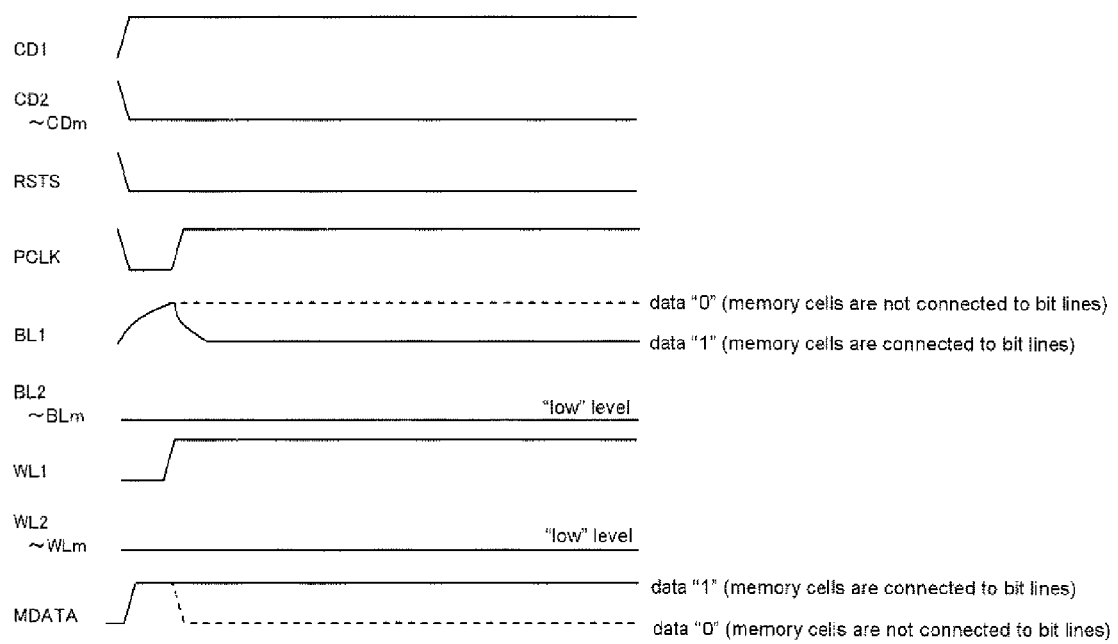
FIG. 13 is a timing chart showing the operation of the conventional art semiconductor memory device.

The reading operation of data of, for instance, the memory cells M(1, 1) included in the semiconductor memory device having such a configuration will be described with reference to the FIG. 11 timing chart.

Among the reset selection signal lines RSTj (j=1 to n), the reset selection signal line RST1 is brought low and the reset selection signal lines RST2 to RSTn are brought high. As a result, among the transistors constituting the bit line reset circuit 3, the transistor QNR1 is turned off and the other transistors QNR2 to QNRn are turned on. Further, among the charge selection signal lines PDECj (j=1 to n), the charge selection signal line PDEC1 is brought high and the charge selection signal lines PDEC2 to PDECn are brought low. As a consequence, among the transistors constituting the bit line charge circuit 7, the transistor QND1 is turned on and the other transistors QND2 to QNDn are turned off. Still further, the read signal line SEL is brought high, the transistor QNS is turned on, and the transistor QPS is turned off. Furthermore, all the word lines WL1 to WLm are brought low and all the memory cells M(i, j) (i=1 to m, and j=1 to n) are turned off.

Then, among the precharge selection signal lines DPCLK1 to DPCLKn, the precharge selection signal line DPCLK1 is brought high and the precharge selection signal lines DPCLK2 to DPCLKn are brought low. As a result, among the transistors constituting the bit line precharge circuit 14, the transistor QNCP1 is turned on and the transistors QNCP2 to QNCPn are turned off. Further, the precharge signal line PCLK is brought low for a fixed time, thereby the transistor QPP is turned on and the bit line BL1 is charged high via the on-state transistor QNCP1. Still further, since the transistors QNCP2 to QNCPn are off, the bit lines BL2 to BLn are brought low without being charged.

After the bit line BL1 has become high, the word line WL1 is shifted from the low level, which means a non-selected state, to the high level, which means a selected state, and the read signal line SEL is brought low.

Because of this, when the drain of the memory cell M(1, 1) is connected to the bit line BL1, electric charge supplied to the bit line BL1 by the transistor QPP is discharged by the memory cell M(1, 1), so that the bit line BL1 becomes low. In contrast to this, when the drain of the memory cell M(1, 1) is not connected to the bit line BL1, the electric charge supplied to the bit line BL1 by the transistor QPP is not discharged by the memory cell M(1, 1), so that the bit line BL1 is held high; the bit lines BL2 to BLn become low because the transistors QNR2 to QNRn are on.

As a consequence, among the transistors QNB1 to QNBn, the transistors QNB2 to QNBn, whose gates are each connected to the bit lines BL2 to BLn, are turned off. Moreover, when the drain of the memory cell M(1, 1) is not connected to the bit line BL1, the bit line BL1 becomes high, so that the transistor QNB1 whose gate is connected to the bit line BL1 is turned on. As a result, electric charge supplied to the output terminal MDATA by the transistor QPS, whose gate is connected to the read signal line SEL, is discharged by the transistor QNB1, so that the output terminal MDATA becomes low. In contrast to this, when the drain of the memory cell M(1, 1) is connected to the bit line BL1, the bit line BL1 becomes low, so that the transistor QNB1 is turned off. As a consequence, the electric charge supplied to the output terminal MDATA by the transistor QPS, whose gate is connected to the read signal line SEL, is not discharged by the transistor QNB1, so that the output terminal MDATA becomes high.

As described above, according to this embodiment, the reading operation can be performed even in a low-voltage stage as in the case of the second embodiment, and the same effects as those described in the second embodiment can be achieved.

Moreover, by providing the common, that is, single transistor QPP used for precharging the bit lines to the plural bit lines instead of providing the transistor QPP to the individual bit lines, it is possible to secure a large mask layout region for the transistor QPP used for precharging the bit lines. Because of this, the amount of the ON-state current of the transistor QPP used for precharging the bit lines can be increased greatly. As a result, the time required for the bit lines to be precharged can be reduced further, which allows a higher-speed reading operation.

Here, the reason why the amount of the ON-state current of the transistor QPP can be increased greatly despite the addition of the N-type MOS transistors QNCPj (j=1 to n) in consideration of the provision of the single P-type MOS transistor QPP is as follows: since the ability of the N-type MOS transistor to drive electric current is generally higher than that of the P-type MOS transistor, the provision of the N-type MOS transistor to the individual bit lines can make precharge current larger than the provision of the P-type MOS transistor.

In the bit line precharge circuit 14 of the semiconductor memory device according to this embodiment, although the transistors for selecting the bit lines QNCPj (j=1 to n), whose sources are connected to the individual bit lines, are the N-type MOS transistors and the transistors for precharging QPP, whose drain is connected to the power supply potential line, is the P-type MOS transistor, even when all the transistors are the P-type MOS transistors or the N-type MOS transistors, the same effect can be achieved.

INDUSTRIAL APPLICABILITY

In the semiconductor memory device according to the present invention, the transistors for supplying the electric charge corresponding to the OFF leakage currents developed at memory cells and the read circuit are direct-connected to the bit lines. Therefore, the semiconductor memory device according to the invention is useful as a circuit technology in which the reading limit of memory cell data is placed to the lower voltage range where the influence of the raised threshold value resulting from the substrate bias effect becomes great.

The invention claimed is:

1. A semiconductor memory device comprising:
a memory cell array which has a plurality of memory cells arranged in matrix form, a plurality of word lines connected to the memory cells, and a plurality of bit lines connected to the memory cells;
a charge circuit which includes a plurality of charging transistors which charge the bit lines, respectively;
a bit line reset circuit which includes a plurality of resetting transistors respectively forcing potentials of the bit lines to a around potential, and
a read circuit which includes a plurality of reading transistors whose gates are each connected to the bit lines and which outputs information according to the on and off states of the reading transistors, wherein:
the charge circuit has a configuration in which at least two charging transistors are provided to the individual bit lines,
at least one of at the least two charging transistors are each connected to the individual bit lines, and
the remaining charging transistors are in a floating state in relation to the individual bit lines.

2. The semiconductor memory device according to claim 1, wherein
the charge circuit has a configuration in which the gates of the charging transistors are each connected to a plurality of decode signal lines for selecting the bit lines and
the bit line reset circuit has a configuration in which the gates of the resetting transistors are each connected to a plurality of reset signal lines.

3. The semiconductor memory device according to claim 1, wherein the connect structure of the charging transistors to the bit lines is the same as that of the memory cells to the bit lines.

* * * * *